(12) United States Patent
Bergogne (10) Patent No.: US 11,588,390 B2
(45) Date of Patent: Feb. 21, 2023

(54) BIDIRECTIONAL SWITCH CONTROL

(71) Applicant: Commissariat à l'Energie Atomique et aux Energies Alternatives, Paris (FR)

(72) Inventor: Dominique Bergogne, Grenoble (FR)

(73) Assignee: Commissariat à l'Energie Atomique et aux Energies Alternatives, Paris (FR)

(*) Notice: Subject to any disclaimer, the term of this patent is extended or adjusted under 35 U.S.C. 154(b) by 245 days.

(21) Appl. No.: 17/247,071

(22) Filed: Nov. 27, 2020

(65) Prior Publication Data

US 2021/0167678 A1 Jun. 3, 2021

(30) Foreign Application Priority Data

Nov. 28, 2019 (FR) ...................................... 1913396

(51) Int. Cl.
*H02M 1/08* (2006.01)
*H03K 17/10* (2006.01)
(Continued)

(52) U.S. Cl.
CPC ....... *H02M 1/0054* (2021.05); *H02M 1/0058* (2021.05); *H02M 1/08* (2013.01);
(Continued)

(58) Field of Classification Search
CPC .... H02M 1/0054; H02M 1/0058; H02M 1/08; H02M 1/38; H02M 7/792; H03K 17/102; H03K 2217/0009
(Continued)

(56) References Cited

U.S. PATENT DOCUMENTS

| 2011/0026285 A1* | 2/2011 | Kawashima | ........ H02M 1/4208 |
| | | | 327/427 |
| 2013/0257406 A1* | 10/2013 | Hausman, Jr | .......... H05B 45/37 |
| | | | 323/300 |
| 2016/0079233 A1 | 3/2016 | Deboy et al. | |

FOREIGN PATENT DOCUMENTS

DE    102015011396 A1    3/2017

OTHER PUBLICATIONS

Preliminary Search Report for French Application No. 1913396 dated Jul. 13, 2020, 2 pages.

* cited by examiner

*Primary Examiner* — William Hernandez
(74) *Attorney, Agent, or Firm* — Moreno IP Law LLC (57) ABSTRACT

The present description concerns a method of controlling a bidirectional switch (200), including: first (210 1) and (210 2) field-effect transistors electrically in series between first (262 1) and second (262 2) terminals of the bidirectional switch; third (614) and fourth (612) field-effect transistors electrically in series between said first and second terminals of the bidirectional switch, a first connection node (252) in series with the first and second transistors being common with a second connection node (616) in series with the third and fourth transistors, including steps of: receiving a voltage (V200) between the terminals of the bidirectional switch; detecting, from the received voltage, a first sign of said voltage; at least while the first sign is being detected, coupling the first terminal to said first node (252), potentials of control terminals of the first, second, third, and fourth transistors being referenced to the potential (REF) of the first and second nodes having common sources of the first, second, third, and fourth transistors connected thereto.

18 Claims, 6 Drawing Sheets

(51) Int. Cl.
*H02M 1/00* (2006.01)
*H02M 1/38* (2007.01)
*H02M 7/797* (2006.01)

(52) U.S. Cl.
CPC .............. *H02M 1/38* (2013.01); *H02M 7/797* (2013.01); *H03K 17/102* (2013.01); *H03K 2217/0009* (2013.01)

(58) Field of Classification Search
USPC ........................................................ 327/427
See application file for complete search history.

BIDIRECTIONAL SWITCH CONTROL

FIELD

The present disclosure generally concerns electronic devices, in particular, switched-mode converters.

BACKGROUND

Switched-mode converters use one or a plurality of switches alternately set to the on and off states at a switching frequency. Switched-mode converters are used to deliver a voltage and/or a current from a power supply having voltage/current values different from the values of the voltage/current to be delivered. For example, an AC/DC (alternating current-direct current) switched-mode converter enables to obtain a DC voltage from an AC voltage such as that of an electric network or of an alternator.

SUMMARY

There is a need to improve the operation of known switched-mode converters, in particular of known converters receiving and/or delivering an AC voltage.

There is a need to increase the efficiency of known switched-mode converters, in particular of known converters receiving and/or delivering an AC voltage.

There is a need to simplify the implementation of known switched-mode converters, in particular of known converters receiving and/or delivering an AC voltage.

An embodiment overcomes all or part of the disadvantages of known circuits for controlling switches of switched-mode converters.

An embodiment overcomes all or part of the disadvantages of known switched-mode converters.

An embodiment enables to improve and to ascertain the reliability of the operation of a switch of a switched-mode converter.

An embodiment enables to particularly simply implement switches of a switched-mode converter.

An embodiment provides a method of controlling a bidirectional switch, comprising:
  first and second field-effect transistors electrically in series between first and second terminals of the bidirectional switch;
  third and fourth field-effect transistors electrically in series between said first and second terminals of the bidirectional switch, a first series connection node of the first and second transistors being common with a second series connection node of the third and fourth transistors,
comprising steps of:
  receiving a voltage between the terminals of the bidirectional switch;
  detecting, based on the received voltage, a first sign of said voltage;
  at least while the first sign is being detected, coupling the first terminal to said first node, potentials of control terminals of the first, second, third, and fourth transistors being referenced to the potential of the first and second nodes having common sources of the first, second, third, and fourth transistors connected thereto.

According to an embodiment, the step of connection of the first terminal to said connection node comprises maintaining the first transistor in an on state.

According to an embodiment, the method further comprises, during the step of connection of the first terminal to said connection node, steps of:
  setting the second transistor to an off state;
  when the second transistor is in the off state, generating a current in parallel with the second transistor between the terminals of the second transistor, powered with a voltage between the terminals of the second transistor; and
  switching the second transistor from the off state to an on state at a time when the current in parallel with the second transistor becomes smaller than a current threshold.

According to an embodiment, the method further comprises steps of:
  detecting a second sign of the voltage between the terminals of the bidirectional switch; and
  at least while the second sign is being detected, connecting the second terminal to said connection node, preferably by maintaining the second transistor in an on state.

According to an embodiment, the method further comprises, during the step of connection of the second terminal to said connection node, steps of:
  setting the first transistor to an off state;
  when the first transistor is in the off state, generating a current in parallel with the first transistor, powered with a voltage between the terminals of the first transistor; and
  switching the first transistor from the off state to an on state at a time when the current in parallel with the first transistor becomes smaller than a current threshold.

According to an embodiment, the transistors are of the same channel type, preferably GaN HEMT-type transistors.

According to an embodiment, said bidirectional switch is monolithic and comprises a substrate coupled, preferably by an impedance, to the common source terminal.

An embodiment provides a circuit configured to implement the described method.

According to an embodiment, the circuit is intended to be coupled to the terminals of the bidirectional switch, to the common source terminal of the transistors, and to the control terminals.

According to an embodiment, the circuit is intended to be powered with a power supply voltage referenced to the potential of the common source terminal.

According to an embodiment, the circuit comprises:
  a fifth transistor configured to deliver a first signal for authorizing the setting to the on state of the second transistor;
  a first source of a control voltage of the fifth transistor, coupled to a conduction terminal of the second transistor; and
  a first load coupling the control terminal of the fifth transistor to another conduction terminal of the second transistor.

According to an embodiment, the circuit further comprises:
  a sixth transistor configured to deliver a second signal for authorizing the setting to the on state of the first transistor;
  a second source of a control voltage of the sixth transistor, coupled to a conduction terminal of the first transistor; and
  a second load coupling the control terminal of the sixth transistor to another conduction terminal of the sixth transistor.

An embodiment provides a device comprising a circuit such as described and said bidirectional switch.

An embodiment provides a monolithic device comprising a circuit or a device comprising such a circuit, such as described.

An embodiment provides a switched-mode converter comprising one or a plurality of devices such as described.

According to an embodiment, the converter is configured to receive and/or deliver an AC voltage, comprising two bidirectional switches, each formed of the first and second transistors of one of said devices, the two bidirectional switches being electrically in series between two nodes of application of the AC voltage.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, a driver (or control, for example, transistor gate control) circuit, provided to apply a control signal to a bidirectional switch (that is, to apply a voltage to a control electrode or control terminal such as a gate of transistors forming the switch), is not described in detail, the described embodiments being compatible with usual driver circuits.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, ordinal numerals such as "first", "second", etc. are only used to distinguish elements from one another. In particular, these adjectives do not limit the described devices and methods to a specific order of these elements.

Figure 1:
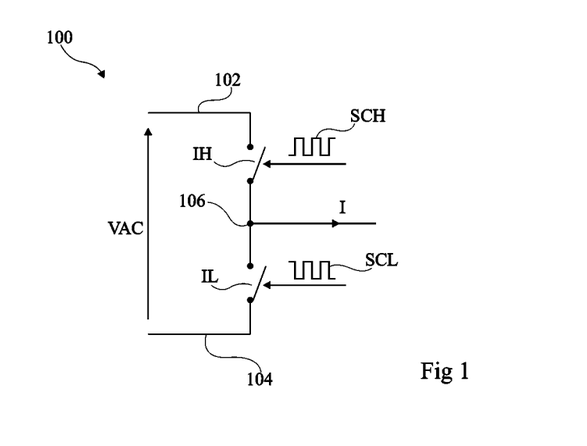
FIG. 1 schematically and partially shows an example of a switching cell of a switched-mode converter powered with an AC voltage, of a type to which the described embodiments apply.

FIG. 1 partially and schematically shows an example of a switching cell 100 of a switched-mode converter, of a type to which the described embodiments apply.

A switching cell is defined by the association of two switches IH and IL electrically in series between nodes 102 and 104. Signals SCH and SCL for controlling the respective switches IH and IL are such that, when one of switches IH and IL is on, the other one of the switches is off. Thus, switches IH and IL are not simultaneously on. Switches IH and IL may also be simultaneously off.

The converter where switching cell 100 is located receives or delivers an AC voltage. Preferably, the converter is of AC/DC type, and the AC voltage is the voltage, received by the converter, from which the converter generates a DC voltage via the switching of the AC voltage. The inverse operation is also possible, the input being on the DC side and the output being on the AC side. In the shown example, switching cell 100 receives AC voltage VAC and delivers, on a connection node 106 in series with switches IH and IL, a current I. Current I is received by elements, not shown, of the converter and used by these elements to generate the DC voltage. Current I is for example the current in an inductance, not shown, internal to the converter. The converter structure, as well as signals SCH and SCL of the switches, is not detailed herein, the described embodiments being compatible with usual switched-mode converters and usual controls of switches of switched-mode converters.

In a typical application, AC voltage VAC originates from an electric power distribution system, and for example has a rms voltage in the order of approximately 110 V or of approximately 230 V, and for example, a frequency equal to 50 Hz or 60 Hz. AC voltage VAC thus is a high voltage, that is, having a peak voltage greater than 100 V, for example equal to approximately 150 V, preferably greater than 300 V, for example equal to approximately 350 V. The DC voltage is typically used to charge a battery, for example, a battery of a laptop computer or of a distant mobile communication device such as a cell phone.

In operation, AC voltage VAC successively takes positive (potential of node 102 greater than that of node 104) and negative (potential of node 102 smaller than that of node 104) values. To ensure this operation, switches IH and IL are bidirectional for the voltage. A switch bidirectional for the voltage is defined by a switch capable, in an off state, of preventing the flowing of a current for both directions of the voltage across the bidirectional switch. The bidirectional switch is configured to, in an on state, allow the flowing of a current running through the bidirectional switch from one terminal to the other of the bidirectional switch.

Further, the supplied current I may be, in certain applications, alternating, for example, current I is alternating at the switching frequency and is supplied to or originates from a transformer, not shown. For this purpose, the switches are further, preferably, bidirectional for the current. A switch bidirectional for the current is defined by a switch capable, in its on state, of enabling a current to flow in both directions between its terminals. The switch bidirectional for the current is configured to, in the on state, electrically connect its terminals together.

Control signals SCH and SCL are typically square pulse signals. Square pulse signal means a signal comprising a succession of cycles, each cycle comprising a portion at a low level of the signal and a portion at a high level of the signal. The cycles of signals SCH and SCL are repeated at a switching frequency. Thus, at the switching frequency, switch IH is turned on and switch IL is turned off and then, in alternation, switch IL is turned on and switch IH is turned off. The switching frequency is higher than that of AC voltage VAC, preferably greater than 1 MHz. The methods of generation of the signals for controlling the various switches of the converter are not described in detail, the described embodiments being compatible with usual methods of generation of signals for controlling switches of a switched-mode converter.

The described embodiments are applicable to any switched-mode converter, in particular, to any converter intended to receive and/or deliver a voltage having different successive signs, that is, an AC voltage. The AC voltage may be single-phase or multiphase. In particular, the described embodiments are applicable to any converter comprising, between two nodes of application of the AC voltage or of a phase of the AC voltage, one or a plurality of branches in parallel, each formed of a switching cell comprising at least two switches in series. One at least of these two switches is bidirectional. Bidirectional means bidirectional for the voltage and, preferably, for the current. Preferably, in the or each branch, the two switches are bidirectional.

Figure 2:
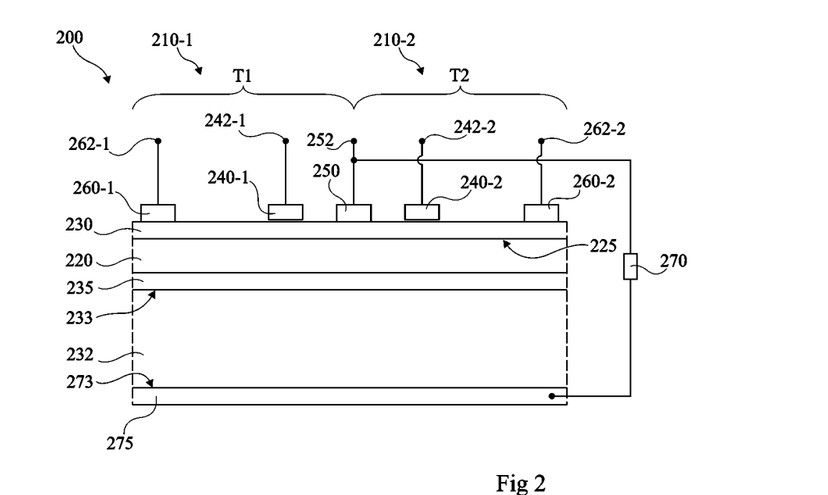
FIG. 2 shows a simplified cross-section view of a bidirectional switch of a type to which the described embodiments apply, capable of being used in a switching cell such as that of FIG. 1.

FIG. 2 shows, in a simplified cross-section view, an example of a bidirectional switch 200 of a type to which the described embodiments apply. Bidirectional switch 200 may form any bidirectional switch of a switched-mode converter such as described hereabove. For example, the switches IH and IL of the switching cell 100 of FIG. 1 are each identical or similar to bidirectional switch 200.

Bidirectional switch 200 comprises two switches 210-1 and 210-2 electrically in series. Preferably, switches 210-1 and 210-2 comprise respective field-effect transistors T1 and T2. Transistors T1 and T2 may then be of any field-effect type. However, preferably, transistors T1 and T2 are of the shown type, called high electron mobility transistor, HEMT. Such transistors comprise two semiconductor layers 220 and 230 having different bandgaps and in contact with each other, semiconductor layers 220 and 230 then defining together an interface 225 along which electrons are mobile. Such a transistor enables to block higher voltages and enables faster switchings than other types of field-effect transistors. More preferably, the semiconductors of layers 220 and 230 respectively are gallium nitride GaN and aluminum-gallium nitride AlGaN. It is then spoken of a GaN HEMT-type transistor.

Layers 220 and 230 typically rest on a support 232. More particularly, layers 220 and 230 rest on a surface 233 of substrate 232 (upper surface in FIG. 2, also called front surface). Support 232 is for example a portion of a semiconductor wafer, such as a silicon wafer. Support 232 may be covered with buffer layers 235 located between support 232 and layer 220, intended to ease the forming of layer 220 on support 232. Various elements, such as insulating regions, as well as the materials other than those described hereabove, and dimensions such as the layer thicknesses, are not detailed herein, the described embodiments being compatible with usual GaN HEMT transistors.

Although, in the shown example, each switch 210-1, 210-2 comprises one transistor only, respectively T1, T2, switch 210-1 may comprise a plurality of transistors T1 electrically in parallel with one another, and switch 210-2 may comprise a plurality of transistors T2 electrically in parallel with one another.

Transistors T1 and T2 each comprise a gate, respectively 240-1, 240-2, and a drain region, respectively 260-1, 260-2. In the shown example, the gates and the drain regions are located on layer 230.

Transistors T1 and T2 each comprise a terminal, respectively 242 1, 242 2, coupled, preferably connected, to the respective gates 240 1 and 240 2. Terminals 242 1 and 242 2 form control terminals of the respective switches 210 1 and 210 2. Transistors T1 and T2 each comprise a terminal, respectively 262 1, 262 2 coupled, preferably connected, to the drain region, respectively 260 1, 260 2. Terminals 262 1, 262 2 form the conduction terminals of bidirectional switch 200.

Preferably, bidirectional switch 200 comprises a source terminal 252 common to transistors T1 and T2, connected to a source region 250 common to transistors T1 and T2. In the shown example, common source region 250 is located on layer 230. In each transistor T1, T2, the gates, respectively 240 1, 240 2, is located between the drain region, respectively 260 1, 260 2, and the common source region 250. In a variant, common source terminal 252 is coupled, for example, connected, to distinct source regions in transistors T1 and T2. In another variant, transistors T1 and T2 have distinct source terminals.

Preferably, common source terminal 250 is electrically coupled, or electrically connected, to substrate 232. For this purpose, the back side 273 of substrate 232 is, for example, covered with an electrically-conductive layer 275. More particularly, conductive layer 275 is in contact with substrate 232. The upper surface 233 of the substrate has thus been electrically coupled to source terminal 250. The link between the upper surface 233 of substrate 232 and source terminal 250 comprises an electric link, for example, formed by various conductive elements, preferably an impedance 270, more preferably a resistor. Impedance 270 may be partly or totally formed by substrate 232.

Each transistor T1, T2 is configured so that, when a positive voltage is applied between the drain and the source of the transistor, the on/off state of the transistor is controlled by the voltage between the gate and the source of the transistor. Thus, when the voltage takes high values such as defined hereabove, the most part of this voltage is located between the drain and the gate.

Preferably, as shown, the structures of switches 210-1 and 210-2 formed by layers 220 and 230, gates 240 1, 240 2, and drain 260 1, 260 2 and source 250 regions, are symmetrical to each other with respect to a plane or with respect to an axis running through common source region 250. Symmetrical means symmetrical to within manufacturing dispersions. This enables, as compared with non-symmetrical switches 210-2 and 210-2, to obtain more easily inside and/or on top of a same support 232 a plurality of bidirectional switches 200 with a common source region having identical electric characteristics.

Figure 3:
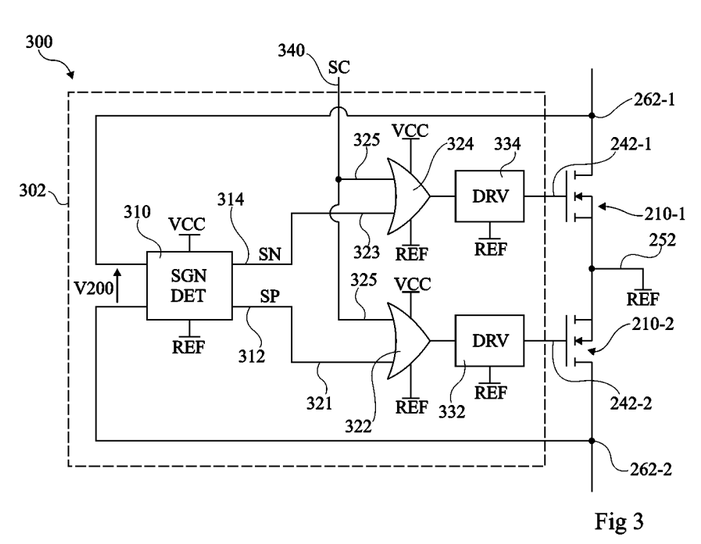
FIG. 3 schematically shows an embodiment of a bidirectional switch control circuit, coupled to a bidirectional switch comprising two transistors.

FIG. 3 schematically shows an embodiment of a device 300 comprising a bidirectional switch control circuit 302, coupled to a bidirectional switch comprising first and second switches electrically in series. Preferably, the first and second switches are identical or similar to the respective switches 210-1 and 210-2 of a bidirectional switch 200 of the type described in relation with FIG. 2. The first and second switches are then in series between terminals 262-1 and 262-2 of the bidirectional switch.

A converter may comprise one, or preferably a plurality of, devices such as device 300. Preferably, a switching cell such as the switching cell 100 described in relation with FIG. 1, or branch of the converter, comprises two devices such as device 300. As a variant, in any usual device comprising one or a plurality of bidirectional switches, this or these switches may be replaced with a device such as device 300.

Preferably, the first and second switches are field-effect switches of the same type, more particularly, of same type N or P of conduction channel. More preferably, the switches are of HEMT type and, more preferably still, the switches are of N-channel GaN HEMT type. In the case where the first and second switches are field-effect transistors of the same type (type N or type P) of channel conductivity, the first and second switches preferably have a common source terminal 252.

Control circuit 302 comprises a circuit 310 (SGN DET) coupled, preferably connected, to terminals 262-1, 262-2 of the bidirectional switch. In operation, circuit 310 receives the voltage V200 present between terminals 262-1 and 262-2 of the bidirectional switch. Voltage V200 may be successively positive (potential of terminal 262-1 greater than that of terminal 262-2) and negative (potential of terminal 262-2 greater than that of terminal 262-1). Based on voltage V200, circuit 310 detects a positive sign of voltage V200 and/or detects a negative sign of voltage V200. Preferably, circuit 310 detects the two signs, positive and negative, of voltage V200. Circuit 310 activates a signal SP on an output 312 when the positive sign is detected, and/or circuit 310 activates a signal SN on an output 314 when the negative sign is detected. As an example, signal SP corresponds to a high level on output 312 and signal SN corresponds to a high level on output 314.

In the shown example, the output 312 of signal SP of detection of the positive sign is coupled, preferably coupled, to an input 321 of a logic OR gate 322. OR gate 322 has an output coupled, preferably connected, to a driver circuit 332 DRV, also called close control circuit, configured to apply the output level of OR gate 322 to the control terminal 242-2 of switch 210-2. Driver circuit 332 sets switch 210-2 to the on state when the output of OR gate 322 is at a high level. Thus, circuit 302 maintains switch 210-2 in the on state when the positive sign is detected, that is, to within the response times of logic gate 322 and of circuit 332, for the entire duration of the periods during which the positive sign is detected by circuit 310. As a variant, circuit 332 is omitted, and its role is directly played by logic gate 322.

In the shown example, output 314 of signal SN of detection of the negative sign is coupled, preferably connected, to an input 323 of a logic OR gate 324. OR gate 324 has an output coupled, preferably connected, to a driver circuit 334 (DRV) configured to apply the output level of OR gate 324 to the control terminal 242-1 of switch 210-1. Driver circuit 334 sets switch 210-1 to the on state when the output of OR gate 324 is at a high level. Thus, circuit 302 maintains switch 210-1 in the on state when the negative sign is detected, that is, to within the response times, for the entire duration of the periods during which the negative sign is detected by circuit 310. As a variant, circuit 334 is omitted, and its role is directly played by logic gate 324.

The shown example is not limiting, and logic gates 322 and 324, and possible circuits 332 and 334 may be replaced with any circuit or circuit assembly configured to:
 maintain the second switch in the on state when the positive sign of voltage V200 is detected by circuit 310; and/or
 maintain the first switch in the on state when the negative sign of voltage V200 is detected by circuit 310.

In the shown example, logic gates 322 and 324 each have an input 325 coupled, preferably connected, to an input 340 of control circuit 302. Input 340 receives a signal SC for controlling the bidirectional switch. Signal SC is typically formed of a signal identical or similar to the signals SCH and SCL described in relation with FIG. 1. Thus, signal SC is preferably a square pulse signal, typically at a switching frequency of a switching cell comprising device 300. Driver circuits 332 and 334 apply control signal SC to respective switches 210-1 and 210-2. More particularly, when the positive sign is detected, control signal SC is applied to switch 210-1 while switch 210-2 is maintained on, which enables to set bidirectional switch 200 to one of the on and off states according to control signal SC only. Similarly, when the negative sign is detected, control signal SC is applied to switch 210-2 while switch 210-1 is maintained on, which enables to set bidirectional switch 200 to one of the on and off states only according to control signal SC.

This example is not limiting, and the above-described circuits capable of replacing logic gates 322 and 324 and the possible circuits 332 and 334 are then further, preferably, configured to:
 apply control signal SC to the second switch when the first switch is maintained on; and/or
 apply control signal SC to the first switch when the second switch is maintained on.

As compared with a variant where circuit 302 receives distinct control signals for the two switches, this enables to control the bidirectional switch in simpler fashion.

It could have been devised to control the two switches simultaneously with the same control signal SC without maintaining one or the other of the switches in the on state. In this case, when control signal SC is at a level controlling an off state of the bidirectional switch, the first and second switches would then be simultaneously off. The connection node between the first and second switches (defined by common source terminal 252 in the shown example) would be at a floating potential, which would have posed various problems. In particular, in the example of switches 210-1 and 210-2 comprising field-effect transistors on a substrate such as the substrate 232 described in relation with FIG. 2, this would have posed problems of charge accumulation in the portion of substrate 232 close to surface 233 under transistors T1 and T2. Such a charge accumulation typically originates from the switching of high voltages such as defined hereabove. This charge accumulation would have been capable of modifying the gate-source voltage thresholds beyond which the transistors are on, and/or of increasing the on-state resistance of the bidirectional switch.

As compared with a method where control signal SC would be simultaneously applied to switches 210-1 and 201-2 with no maintaining in the on state of one of the switches, the embodiments of the method implemented by circuit 302 have the advantage of setting the potential of the connection node between the first and second switches. More particularly, the potential of the connection node (terminal 252) between switches 210-1 and 210-2 is maintained equal to the potential of one of the terminals 262-1 and 262-2 of the bidirectional switch. In the case of N-channel field-effect transistors such as those of switches 210-1 and 210-2, the potential of common source terminal 252 is made equal to the lowest potential among the potentials of terminals 262-1 and 262-2 of the bidirectional switch. In particular, in the case of switches 210-1 and 210-2 comprising field-effect transistors on a same substrate (for example, GaN HEMT-type transistors) having a common source terminal coupled to the substrate, it is avoided for the voltage thresholds for setting switches 210-1 and 210-2 to the on state and/or for the on-state resistance of switches 210-1 and 210-2 to be affected by charge accumulations.

The setting to the on state of switch 210-1 when the negative sign of voltage V200 is detected, connects together the terminals 252 and 262-1 of switch 210-1. Terminals 252 and 262-1, connected together when switch 210-1 is on, form conduction terminals of switch 210-1. Similarly, the setting to the on state of switch 210-2 when the positive sign of voltage V200 is detected, connects together the conduction terminals 252 and 262-2 of switch 210-2.

The above-described advantage of avoiding charge accumulations results from the connection of the conduction terminals together of one or the other of switches 210-1 and 210-2. It could be devised to avoid charge accumulations by providing an additional circuit coupled to node 252 to apply a potential to this node. As compared with a device comprising such an additional circuit, connection node 252 may be coupled to control circuit 302 only, which simplifies device 300.

As compared with a method where the terminals of none of switches 210-1 and 210-2 would be connected together when a high voltage is present across the bidirectional switch, a more reliable operation and a high power efficiency are obtained. According to an embodiment described hereafter in relation with FIG. 6, this may also be obtained by additional switches electrically in parallel. These additional switches are capable of withstanding the high voltage across the bidirectional switch. As compared with the embodiment of FIG. 6, the fact of maintaining switch 210-1 and 210-2 in the on state when the voltage is high across the bidirectional switch enables to avoid the implementation of these bidirectional switches.

It could also have been devised, in the case of a bidirectional switch contained in a switching cell, to detect the sign of the voltage across the switching cell, and to control the first and second switches of the bidirectional switch from the voltage across the switching cell, for example by deducing the sign of the voltage across the bidirectional switch from that of the voltage across the switching cell. However, as compared with such a control method, the fact of directly receiving the voltage present between the terminals of the bidirectional switch, and of detecting the sign of the voltage across the bidirectional switch based on this directly received voltage enables to avoid having to couple control circuit 302 both to the two terminals of the switching cell. The fact of avoiding links between control circuit 302 and the two terminals of the switching cell enables to simplify the use of circuit 302 in a switching cell, as compared with a control circuit provided to be connected at the same time to the two terminals of the switching cell. This enables to simplify the forming of the switching cell, and thus of the converter.

According to an embodiment, circuit 302 is monolithic, that is, all its circuits are circuits integrated inside and or on top of a same support, typically inside and or on top of a same semiconductor wafer portion. Such a monolithic integrated circuit is preferably located in an integrated circuit package. Integrated circuit package means an assembly, preferably tight, having areas of connection or pins of connection to electronic circuits external to the circuit, for example, to a printed circuit board PCB, jutting out of it.

In particular, it may then be provided for the assembly of device 300, comprising circuit 302 and switches 210-1 and 210-2, to be in a same package, for example on a same support (monolithic device 300) or on different supports. This enables to particularly simply manufacture the switching cell.

Preferably, circuit 302 is powered with a voltage VCC, preferably continuous, referenced to the potential REF of common source terminal 252. In the shown example, sign detection circuit 310 and logic gates 322 and 324 are powered with voltage VCC (referenced to potential REF). Further, driver circuits 334 and 332 are preferably referenced to potential REF to apply to the respective control terminals 242-1 and 242-2 control potentials referenced to potential REF.

In a variant, sign detection circuit 310 and logic gates 322 and 324 are referenced to one or a plurality of other potentials, for example, that of one of the terminals of the bidirectional switch. However, as compared with such a variant, the fact of referencing circuit 302 to potential REF enables to avoid a potential level adjustment in order to control switches 210-1 and 210-2. This is all the more advantageous as the voltage between drain terminals 262-1, 262-2 and common source terminal 252 alternately takes, at the switching frequency, the above-defined high values and substantially zero values with respect to these high values. The issues of implementation of a potential level adjustment are thus avoided, as well as the delays in the application of control signal SC which would result from the potential level adjustment.

According to an embodiment, voltage VCC is delivered by a circuit, not shown, contained in circuit 302 and only powered from the variable voltage present between terminals 262-1 and 262-2. Thus, the control circuit 302 of the bidirectional switch may, outside of input 340 of control signal SC, be coupled, preferably connected, only to the common source terminal 252, to the drain terminals 262-1 and 262-2, and to the control terminals 242-1 and 242-2 of the bidirectional switch. The manufacturing of a switching cell, of a converter, or of any device comprising device 300 is then particularly simple, and the implementation of device 300 is also particularly simple.

Figure 4:
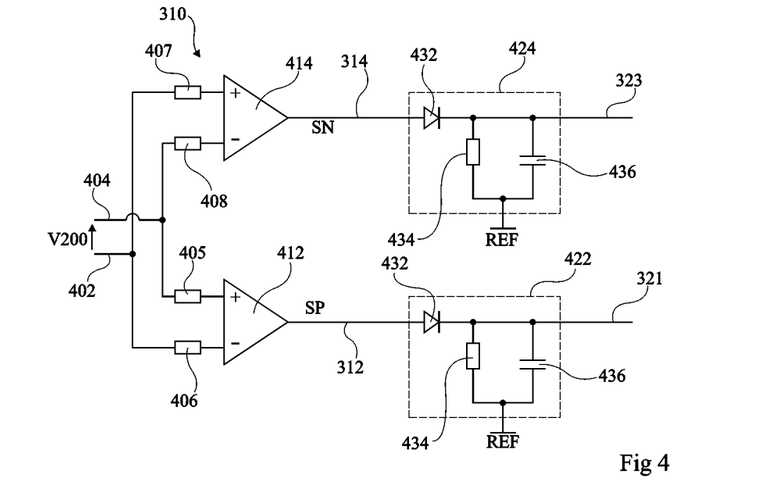
FIG. 4 schematically shows an embodiment of a portion of the control circuit of FIG. 3.

FIG. 4 schematically shows an embodiment of a portion of the control circuit 302 of the device of FIG. 3. In this embodiment, it is provided for the outputs 312 and 314 of sign detection circuit 310 to be connected to the respective inputs 321 and 323 of respective logic gates 322 and 324 (or to the inputs of a circuit playing the role of logic gates 322 and 324 and of circuits 334 and 332) by envelope detectors 422 and 424.

Detection circuit 310 comprises an input formed of two input nodes 402 and 404 coupled, preferably connected, to terminals 262-1 and 262-2 (FIG. 3) of the bidirectional switch. Thus, input nodes 404 and 402 receive the voltage V200 present between the terminals of the bidirectional switch.

In the shown example, detection circuit 310 comprises:
- a comparator 412 having an inverting input (−) coupled, preferably by a resistor 406, to node 402 and a non-inverting input (+) coupled, preferably by a resistor 405, to node 404; and
- preferably, a comparator 414 having a non-inverting input (+) coupled, preferably by a resistor 407, to node 402, and an inverting input (−) coupled, preferably by a resistor 408, to node 404.

The outputs of comparators 412 and 414 form the respective outputs 312 and 314 of circuit 310.

In the shows example, control circuit 302 (FIG. 3) further comprises:
- an envelope detector 422 having an input coupled, preferably connected, to output 312, and an output coupled, preferably connected, to input 321 of logic gate 322 (FIG. 3); and/or
- an envelope detector 424 having an input coupled, preferably connected, to output 314 and an output coupled, preferably connected, to input 323 of logic gate 324 (FIG. 3).

In other words, comparator 412 and envelope detector 422 are in series between, on one side, input nodes 402 and 404, and, on the other side, input 321. Similarly, comparator 414 and envelope detector 424 are in series between, on one side, input nodes 402 and 404 and, on the other side, input 323.

Envelope detectors 422 and 424 are each defined by:
- a diode 432 coupling the input of the envelope detector to an output node of the envelope detector (that is, respectively, input 321 or 323). As an example, diode 432 has its cathode located on the side of the output of the envelope detector; and
- a resistive element 434 and a capacitive element 436 in parallel between the output of the envelope detector and a node coupled, preferably connected, to common source terminal 252 (FIG. 3, at potential REF).

Figure 5:
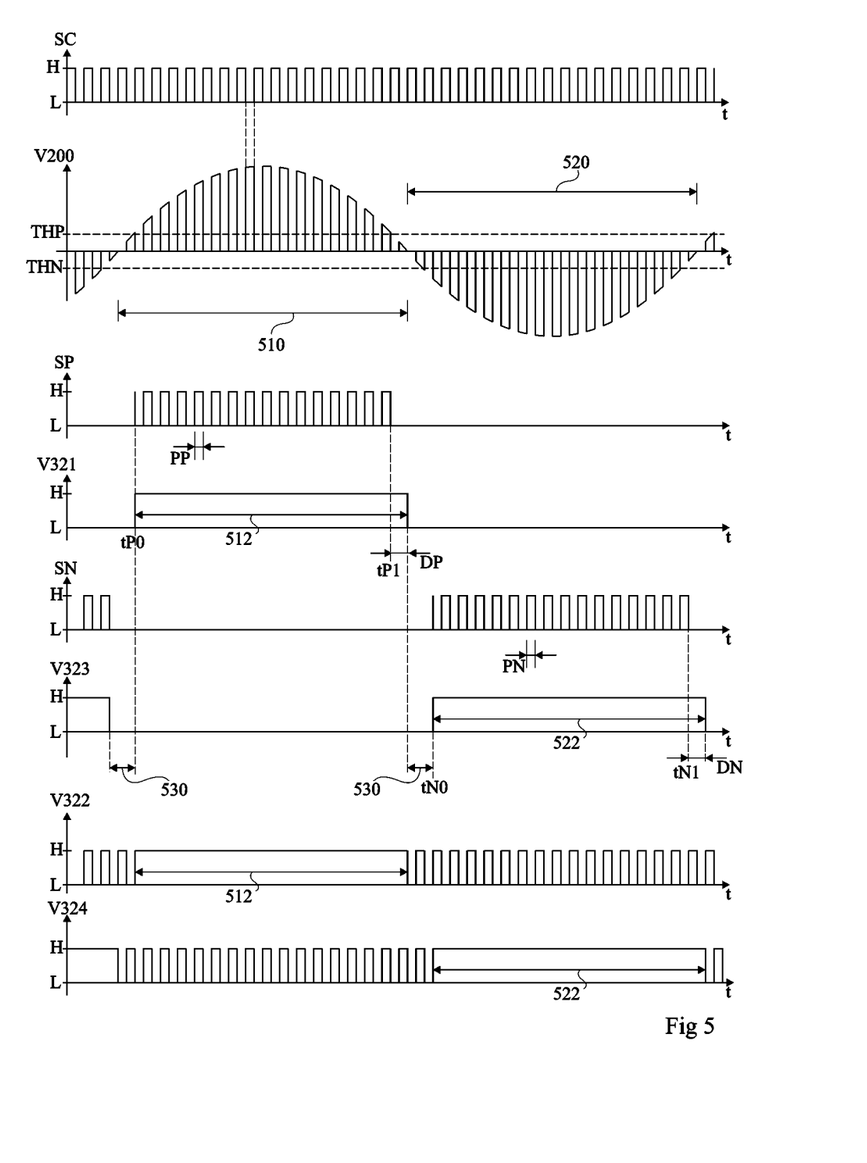
FIG. 5 schematically shows in the form of timing diagrams an embodiment of a method implemented by the control circuit of FIG. 3.

FIG. 5 schematically shows in the form of timing diagrams, an embodiment of a method implemented by the control circuit 302 of FIG. 3. In particular, the method is here implemented in the case of the example of FIG. 4, the device 300 of FIG. 3 being used in a switching cell such as the cell 100 of FIG. 1. More particularly, one has shown, according to time t, simplified curves of:
- the signal SC for controlling the bidirectional switch, received on input 340 of circuit 302;
- the voltage V200 across the bidirectional switch;
- the signal SP of detection of the positive sign of voltage V200;
- an output level V321 of envelope detector 422;
- signal SN of detection of the negative signal of voltage V200;
- an output level V323 of envelope detector 424;
- an output level V322 of logic gate 322; and
- an output level V324 of logic gate 324.

In this example, signal SC is a square pulse signal between a high level (H) and a low level (L). The voltage across the switching cell is alternating and sinusoidal. For the sake of readability, the ratio represented between the frequency of the square pulses of signal SC (switching frequency) and the frequency of the voltage across the switching cell is decreased with respect to typical ratios between these frequencies.

When signal SC is at the high level, the bidirectional switch is on, and the voltage across the bidirectional switch is, as compared with the peak value of the AC voltage, substantially zero. When signal SC is at the low level, the bidirectional switch is off, and the AC voltage across the switching cell is present across the bidirectional switch.

Preferably, the positive sign of voltage V200 is detected when the voltage crosses a positive sign detection threshold THP. After the crossing of threshold THP, the positive sign remains detected at least as long as the voltage is greater than threshold THP. Thus, detection signal SP is activated (high level H) during periods PP when voltage V200 is positive and greater than threshold THP. In the shown example, detection signal SP is deactivated (low level L) outside of these periods.

Preferably, the negative sign of voltage V200 is detected when the voltage is negative and crosses, in absolute value, a negative sign detection threshold THN. After the crossing of threshold THN, the negative sign remains detected as long as the voltage is negative and, in absolute value, greater than threshold THN. Thus, detection signal SN is activated (high level H) during periods PN when voltage V200 is negative and greater, in absolute value, than threshold THN. In the shown example, detection signal SN is deactivated (low level L) outside of these periods.

The fact of providing for the positive and/or negative sign to be detected only when voltage V200 is, in absolute value, greater than a threshold, enables to avoid any risk of detecting at the same time a positive sign and a negative sign of voltage V200 when voltage V200 is close to zero, more particularly when the AC voltage applied to the switching cell is close to zero. It is thus avoided for switches 210-1 and 210-2 to be maintained on at the same time independently from the level of control signal SC, in particular when signal SC is at the low level controlling the bidirectional switch to the off state. It is thus avoided for the bidirectional switch to remain on when control SC requires for it to be turned off. A risk, in a switching cell, for two bidirectional switches to be on at the same time, is thus avoided.

As a variant, usual logic circuits configured to forbid the simultaneous control to the on state of the two switches 210-1 and 210-2 may be provided, as a complement or to replace the sign detection threshold(s). It will be within the abilities of those skilled in the art to insert such logic circuits between the outputs of logic gates 324 and 322 and switches 210-1 and 210-2.

Preferably, envelope detector 422 is such that, after the end of each period PP, the level applied to input 312 of logic gate 322 remains, during a delay DP, greater than a threshold of detection of a high logic level of logic gate 322. Delay DP is longer than a duration between the square pulses during which signal SC is at its high level. Preferably, delay DP is longer than the cycle time of signal SC. Thus, for each period 510 during which the AC voltage applied to the switching cell is positive, level V321 takes the high value (H) at a time tP0 when threshold THP is crossed by voltage V200 at the beginning of period 510. Starting from time tP0, signal SP is a square pulse signal until a time tP1 corresponding to the returning of the AC voltage to a value lower than threshold THP at the end of period 510. Level V321 remains high during a period 512 which starts at time tP0 and ends when delay DP has elapsed from time tP1. Level V321 has the low value (L) outside of periods 512. Thus, in this example, comparator 412 operates at the switching frequency, and envelope detector 422 generates, on its output, an all or nothing signal at the frequency of the AC voltage across the switching cell.

Preferably, envelope detector 424 is such that, after the end of each period PN, the level applied to input 323 of logic gate 324 remains, during a delay DN, greater than a threshold of detection of a high logic level of logic gate 324. Delay DN is longer than a duration between the square pulses during which signal SC is at its high level. Preferably, delay DN is longer than the cycle time of signal SC. Thus, at each period 520 during which the AC voltage applied to the switching cell is negative, level V323 takes the high value at a time tN0 when threshold THN is crossed, in absolute value, by voltage V200 at the beginning of period 520. From time tN0, signal SN is a square pulse signal until time tN1 corresponding to the returning of the AC voltage to a lower value, in absolute value, than threshold THN at the end of period 520. Level V323 remains high during a period 522 which ends when delay DN has elapsed from time tN1. Level V323 has the low value (L) outside of periods 522. Thus, in this example, comparator 414 operates at the switching frequency, and envelope detector 424 generates, on its output, an all or nothing signal at the frequency of the AC voltage across the switching cell.

Switch 210-1 is set to the respective on and off states when level V324 is at the respective high and low levels. Switch 210-2 is set to the respective on and off levels when level V322 is at the respective high and low levels.

Switch 210-2 is thus maintained in the on state, not only during each period PP, but also during the delay DP after the end of each period PP and/or switch 210-1 is maintained in the on state, not only during each period PN, but also during the delay DN after the end of each period PN. This enables to maintain switch 210-2 in the on state, with no interruption during each entire period 512, and/or to maintain switch 210-1 in the on state with no interruption during each entire period 522.

As a variant, envelope detectors 422 and 424 may be omitted. Signals SP and SN are then directly applied to the inputs of respective logic gates 322 and 324. In this case, for each square pulse of control signal SC, switches 210-1 and 210-2 are maintained on by application of signal SC to the switches and, between the square pulses, one or the other switches 210-1 and 210-2 is maintained on according to the sign detected by circuit 310. However, as compared with the case where the envelope detectors or circuits are omitted, the fact of:

maintaining switch 210 1 in the on state during the delay DN after the end of each period PN; and/or
maintaining switch 210 2 in the on state during the delay DP after the end of each period PP, has the advantage of avoiding that, at the end of each square pulse of signal SC, the switch 210 1 or 210 2 maintained on according to the detected sign is temporarily turned off between the time when signal SC switches to the low state and the time when voltage V200 crosses the detection threshold. Various power efficiency losses and various risks for the reliability of the operation are thus avoided.

Although the above-described delays DP and DN are obtained with a specific envelope detector, delays DN and DP may be obtained with any envelope detector. The envelope detector may be replaced with any usual circuit enabling to extend a period by a given delay, for example, a monostable circuit.

Preferably, delays DP and DN, and thresholds THP and THN, are provided so that periods 512 and 522 do not overlap. As an example, periods 530 are provided between the end of each period 512, 522 and the beginning of the next respective period 522, 512. Any risk for switches 210-1 and 210-2 to be simultaneously maintained in the on state when control signal SC is at the low level is thus avoided.

In the above-described method, switch 210-1 is maintained in the on state during periods 522 and signal SC is applied to the control terminal of switch 210-1 only outside of periods 522. Similarly, switch 210-2 is maintained in the on state during periods 512 and signal SC is applied to the control terminal of switch 210-2 only outside of periods 512. Thus, during periods 530, control signal SC is simultaneously applied to the switches 210-1 and 210-2, which enables to control the state of the bidirectional switch with signal SC only. Preferably, delays DP and DN, and thresholds THP and THN are selected so that periods 530 have a duration shorter than 10%, preferably shorter than 1%, more preferably shorter than 0.1% of the duration of a cycle of the AC voltage applied to the switching cell (this duration is the sum of the durations of periods 510 and 520). For this purpose, as an example, delays DP and DN are for example shorter than 0.5 ms, more preferably shorter than 0.1 ms, and thresholds THP and THN are shorter than 50 V, preferably shorter than 10 V. Such delays are more particularly advantageous for the input voltage of an electric power distribution system, for example, approximately 230 V rms and 50 Hz. Based on this, it will be within the abilities of those skilled in the art to define the delays according to the rms voltage applied to the switching cell.

A specific example of a device where, for each positive and negative sign, the respective comparator 412, 414 and the respective envelope detector 422, 424 are in series in a specific order between, on the one hand, input nodes 402 and 404 and, on the other hand, respective input 321 or 323, has been described hereabove in relation with FIGS. 4 and 5. However, it is possible, for each sign, to exchange the positions of the comparator and of the envelope detector in series. Thus, for each sign, the envelope detector is on the side of inputs nodes 402 and 404 and the comparator is on the side of respective input 321 or 323. In this case, as previously, the positive and negative signs are detected at least during respective periods PP, PN, when voltage V200 is greater, in absolute value, to respective threshold THP, THN. The operation differs from the operation of the example of FIG. 4 essentially in that the positive and negative signs are detected not only during respective periods PP and PN, but also during a respective delay DN, DP after these periods. As compared with the operation of the example of FIG. 4, such a difference does not modify the control signals applied to switches 210-1 and 210-2, that is:

switch 210 2 is maintained on during periods 512;
switch 210 1 is maintained on during periods 522;
control signal SC is applied to switch 210 2 outside of periods 512; and
control signal SC is applied to switch 210 1 outside of periods 522.

Figure 6:
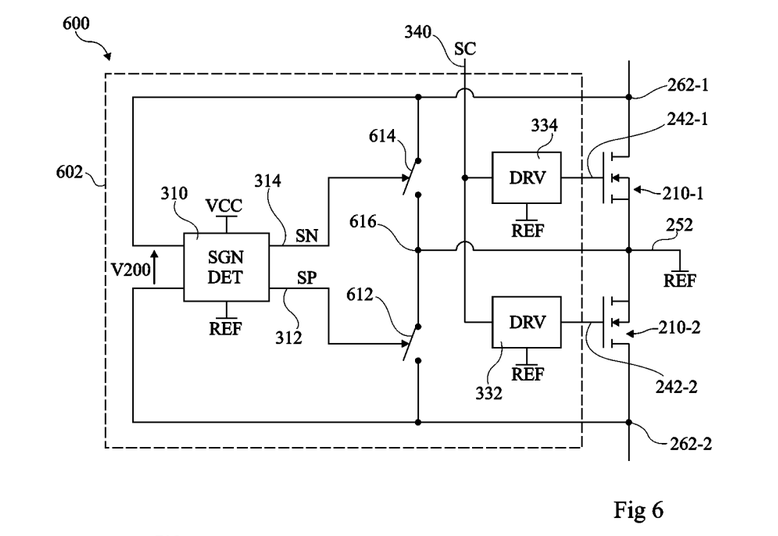
FIG. 6 schematically shows another embodiment of a bidirectional switch control circuit coupled to a bidirectional switch comprising two switches.

FIG. 6 schematically shows another embodiment of a device 600 comprising a bidirectional switch control circuit 602, coupled to a bidirectional switch comprising first and second switches, 210-1 and 210-2, in series.

Device 600 and circuit 602 use elements identical or similar to those of device 300 and to the circuit 302 of FIG. 3. These elements are not described in detail again herein. Only the differences are highlighted. A converter may comprise one or a plurality of devices such as devices 300 and 600. It may be provided for device 600 to be entirely within a same package, for example to be monolithic.

Device 600 differs from the device 300 of FIG. 3 in that circuit 302 is replaced with circuit 602. Circuit 602 differs from the circuit 302 of FIG. 3 in that OR gates 322 and 324 have been replaced with two additional switches 612 and 614. Additional switch 612 is electrically in parallel with second switch 210 2. Additional switch 614 is electrically in parallel with second switch 210 2. In other words, each of the additional switches, respectively 612 and 614, couples together the conduction terminals of respective switches 210 2, 210 1. Thus, a connection node 616 in series with additional switches 612 and 614 is coupled, preferably connected, to common source terminal 252.

Switches 612 and 614 are controlled by the respective signals SN and SP delivered by sign detection circuit 310. Driver circuits 332 and 334 receive the signal SC to be applied to respective switches 210-1 and 210-2.

In operation, switch 612 is on all along the periods during which the positive sign of voltage V200 is detected by circuit 310. Switch 614 is on all along the periods during which the negative sign of voltage V200 is detected by circuit 310. The circuit 602 of FIG. 6 may thus implement a method identical or similar to that implemented by the circuit 302 of FIG. 3, for example, as described in relation with FIG. 5, with the difference that:

when the positive sign is detected, the connection between the terminals of switch 210 2 is performed by switch 614. The state of switch 210 2 is then preferably alternately on and off at the switching frequency; and
when the negative sign is detected, the connection between the terminals of switch 210 1 is performed by switch 612. The state of switch 210 1 is then preferably alternately on and off at the switching frequency.

As previously mentioned, as for the embodiment of FIG. 3, it is thus avoided for the turn-on voltage thresholds of switches 210-1 and 210-2 and/or the on-state resistance of switches 210-1 and 210-2 to be affected by charge accumulations.

Preferably, switches 614 and 612 are field-effect transistors, typically transistors of the same nature as transistors 210-1 and 210-2.

The applications targeted by the present disclosure are power applications. In other words, transistors 210-1 and 210-2 and switches 614 and 612 are sized for powers of several Watts, typically greater than 10 Watts. Further, it being a power converter, the switching frequency of voltage V200 operated by transistors 210-1 and 210-2 is of a few MHz, typically smaller than 10 MHz, while remaining greater, by a ratio of at least 100, than the switching frequency of switches 612 and 614.

According to a specific embodiment, the switching frequency of transistors 612 and 614 corresponds to the frequency of AC voltage V200, for example, the voltage of the electric distribution network, while the switching frequency of transistors 210 1 and 210 2 is of several kHz (while remaining smaller than 10 MHz) and is selected according to the desired switching frequency in the targeted application.

Such power applications have specific issues. In particular, the on-state resistances of switches 210-1, 210-2, 612, and 614 should be compatible with a low dissipation, and thus remain small, but above all be symmetrical in a same branch. In other words, the on-state resistance of transistor 210-1 is approximately identical, preferably identical, to that of transistor 210-2. Similarly, the on-state resistance of transistor 614 is approximately identical, preferably identical, to that of transistor 612. More preferably, all transistors 210-1, 210-2, 612, and 614 have approximately identical, preferably identical, on-state resistances. Thus, the geometries (ratio W/L, that is, gate width to length) of the transistors forming switches 210-1, 201-2, 612, 614 are, at least for the transistors of a same branch, approximately identical, preferably identical.

With identical geometries, the current in each transistor of a given branch is identical to the current flowing through the other transistor of the same branch even though their conduction is not simultaneous. This takes part in the balance of the power transferred during positive and negative half-waves of the converted AC voltage. This particularly distinguishes the described structure from structures which would be capable of existing for very high-frequency (in the order of some hundred MHz) and low-power (in the order of a few Watts) applications where differences between the on-state resistances of transistors in series may be searched for.

A feature of the described embodiments, and more particularly of the embodiment of FIG. 6, is to analyze the polarity of voltage V200 to organize the switching of transistors 612 and 614. This analysis by detector 310 is performed during the operation of device 600 and of the system where it is integrated. This is not a configuration achieved on design or on assembly of the circuit in its application environment, but a permanent detection when the system where the circuit is integrated is in operation.

Another feature of the described embodiments is that the control signals, delivered by detector 310 for transistors 612 and 614 and by circuits 332 and 334 for transistors 210-2 and 210-1, are all referenced to potential Vref, that is, to the potential of the sources of transistors 210-2 and 210-1 and, preferably, of transistors 612 and 614.

Figure 7:
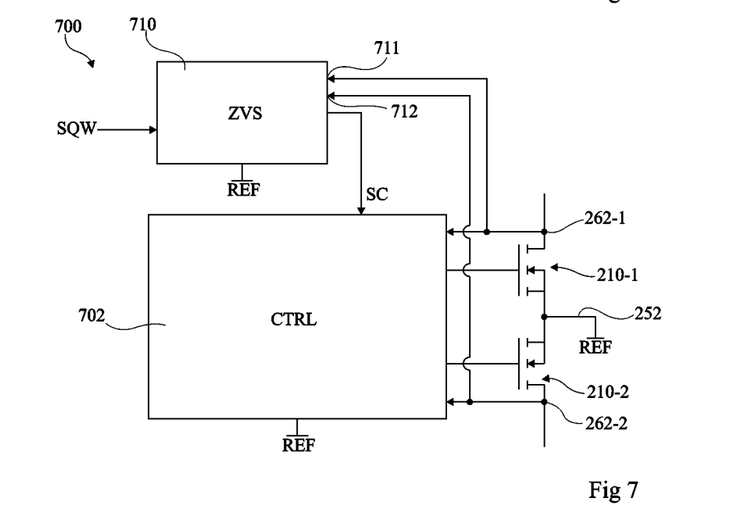
FIG. 7 very schematically shows still another embodiment of a bidirectional switch control circuit, coupled to a bidirectional switch comprising two switches.

FIG. 7 very schematically shows still another embodiment of a device 700 comprising a bidirectional switch control circuit 702 (CTRL), coupled to a bidirectional switch comprising first and second switches, respectively 210-1 and 210-2. Circuit 702 may be identical or similar to the circuit 302 of FIG. 3 or to the circuit 602 of FIG. 6. Device 700 is then identical or similar to the device 300 of FIG. 3 or to the device 600 of FIG. 6.

Device 700 further comprises a zero voltage switching module 710 ZVS. Device 700 delivers bidirectional switch control signal SC. Module 710 receives the voltage across the bidirectional switch on inputs 711 and 712 coupled, preferably connected, to the respective terminals 262-1 and 262-2 of the bidirectional switch. Module 710 receives a control signal SQW, preferably a square pulse signal. Signal SQW may be identical or similar to the signals SCH and SCL described in relation with FIG. 1. The signal SC delivered by module 710 is referenced to the potential REF of common source terminal 252. In other words, module 710 is coupled, preferably connected, to common source terminal 252.

Figure 8:
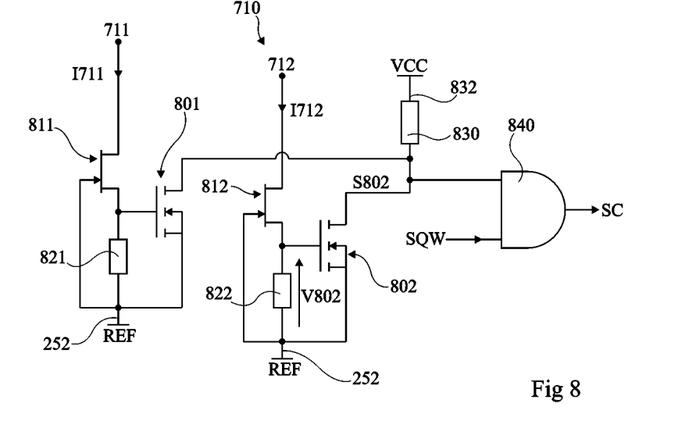
FIG. 8 schematically shows an example of an embodiment of a module of the circuit of FIG. 7.

FIG. 8 schematically shows an embodiment of the module 710 of the circuit of FIG. 7.

Module 710 comprises a transistor 802, for example, an N-channel field-effect transistor. Transistor 802 has a source terminal coupled, preferably connected, to common source terminal 252 having its potential REF used as a reference for module 710.

Module 710 further comprises a transistor 812, preferably of field-effect type and conductive when the gate-source control voltage is zero. Such a transistor may be an N-channel junction field effect transistor JFET. Transistor 812 has a drain terminal coupled, preferably connected, to input 712 of module 710. The gate or control terminal of transistor 812 is coupled, preferably connected, to common source terminal 252.

Module 710 further comprises a resistive element 822. Such a resistive element may be formed by a resistor or by a plurality of resistors in series and/or in parallel. Resistive element 822 couples the gate terminal (control terminal) of transistor 802 to common source terminal 252.

Module 710 further comprises a resistive element 830. Resistive element 830 couples, preferably connects, the drain terminal of transistor 802 to a node 832 of application of a power supply voltage, preferably the power supply voltage VCC of circuit 310 (FIG. 3).

Module 710 comprises an AND logic gate 840. AND gate 840 has an input coupled, preferably connected, to the drain of transistor 802. Logic AND gate is powered, preferably, by voltage VCC referenced to potential VREF (not shown).

In operation, in the above-described portion of module 710, JFET transistor 812 forms a source of a control voltage V802 of transistor 802. As a variant, JFET transistor 812 may be replaced with any element capable of forming a voltage source powered with the voltage between input 712 and terminal 252.

Resistive element 822 forms a load powered with voltage V802. This load causes the flowing of a current between the gate terminal of transistor 802 and common source terminal 252. This results in a current I712 originating from terminal 262-2 (FIG. 7) of switch 210-2 (FIG. 7), entering through input 712, flowing through transistor 812 and resistive element 822, and reaching terminal 252. In other words, current I712 is in parallel between the terminals of second switch 210-2. As a variant, resistive element 822 may be replaced with any load capable of conducting a current when a voltage is applied thereacross.

Transistor 802 has a threshold voltage. When control voltage V802 is greater than the threshold voltage of transistor 802, transistor 802 is in the on state. This occurs when current I712 has a value smaller than a current threshold ITH. When voltage V802 is smaller than the threshold voltage of transistor 802, transistor 802 is in the off state. This occurs when current I712 has a value smaller than current threshold ITH.

Resistive element 830 enables to power a signal S802 delivered on the drain of transistor 802. Signal S802 is a function of the off/on state of transistor 802. In other words, transistor 802 is configured to deliver signal S802. Resistive element 830 may be replaced with any element enabling transistor 802 to deliver a signal.

In the shown example, signal S802 is at the low level when transistor 802 is on. As a variant, transistor 802 and resistive element 830 may be replaced with any circuit enabling to compare current I712 with current threshold ITH and to deliver a signal representative of the result of the comparison.

When signal S802 is at the low level, the signal SC delivered by AND gate 840 remains at the low level whatever the level of control signal SQW. When signal S802 is at the high level, the signal SC delivered by AND gate 840 takes the level of control signal SQW. In other words, signal S802 forms a signal authorizing control signal SC to take a bidirectional switch turn-on state.

Preferably, module 710 further comprises:
a transistor 801, preferably identical or similar to transistor 802. Transistor 801 has a source terminal coupled, preferably connected, to common source terminal 252;
a transistor 811, preferably identical or similar to transistor 812. Transistor 811 has a drain terminal coupled, preferably connected, to input 711 of module 710 and a control terminal coupled, preferably connected, to common source terminal 252; and
a resistive element 821, preferably having a value equal to that of resistive element 822. Resistive element 821 couples the gate terminal of transistor 801 to common source terminal 252. This results, in operation, in a current I711 flowing parallel to first switch 210-1 (FIG. 7).

In the shown example, the drain terminal of transistor 801 is coupled to terminal 831 of application of voltage VCC by resistive element 830. Thus, signal S802 is in the high state when the two transistors 801 and 802 are off, and in the low stat when at least one of the two transistors 801 and 802 is on the on state. In other words, transistors 801, 802 and resistive element 830 compare the two currents I711 and I712 with the current threshold, and authorize control signal SC to take a bidirectional switch turn-on state only when both currents have values smaller than the current threshold.

In other examples, the link between the drain terminal of transistor 801 and resistive element 830 may be replaced with any circuit capable of enabling transistor 801 to deliver a signal representative of its on/off state, and of performing a logic AND function between this signal and the signal S802 output by transistor 802.

As a variant, transistors 801 and 802 and resistive element 830 may be replaced with any circuit capable of comparing each of currents I711 and I712 with a current threshold and of delivering a signal authorizing control signal SC to take a bidirectional switch turn-on state.

Figure 9:
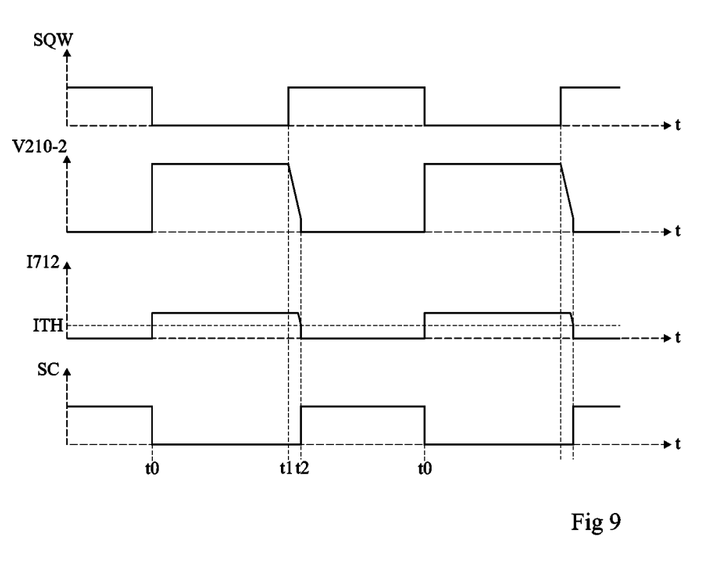
FIG. 9 schematically shows in the form of timing diagrams an example of an embodiment of a method implemented by the module of FIG. 8.

FIG. 9 schematically shows in the form of timing diagrams an embodiment of a method implemented by the module of FIG. 8. More particularly, one has shown, according to time, curves:
of the control signal SQW received by module 710;
of a voltage V210-2 across the second switch;
of the current I712 flowing parallel to the second switch; and
of the control signal SC applied to the bidirectional switch by circuit 702 (FIG. 7).

As an example, these curves are shown during a period for which circuit 702 maintains first switch 210-2 in the on state due to the detected sign of voltage V200 across the bidirectional switch. In the example of the method of FIG. 5, this corresponds to one of the periods 522 of detection of the negative sign of voltage V200.

Signal SQW has repeated cycles. At each of the cycles, signal SQW switches from the high state to the low state at a time t0 and from the low state to the high state at a time t1. At each of times t0 of switching of signal SQW from the low state to the high state, signal SC switches from the high bidirectional switch turn-on state to the low bidirectional switch turn-on state. The bidirectional switch switches from the on state to the off state.

For example, at time to, the voltage V210-1 across the second switch switches from a zero or substantially zero value to a value equal or substantially equal to the voltage V200 across the bidirectional switch. The details of this switching are not shown.

Current I712 switches from a zero value to a non-zero value at time t0 from which current I712 is powered with the voltage V210-2 across the second switch. Such a non-zero value of current I712 is a function of the voltage V802 output by JFET transistor 812 and of the resistance value of resistive element 822. This non-zero value of current I712 is greater than current threshold ITH.

At each cycle, at time t1 of switching of signal SQW from the high state to the low state, the bidirectional switch remains in the off state due to the fact that the value of current I712 is greater than threshold ITH. However, from this time, a current flows through the bidirectional switch, passing through various parasitic capacitive elements (not shown) of the bidirectional switch. In the example where the bidirectional switch forms the switch IH (FIG. 1) of a cell such as the cell 100 of FIG. 1, this may be obtained by switching switch IL from the on state to the off state at time t1. The current flowing through switch IH is then formed of a portion of the current I (FIG. 1) supplied/received by the switching cell and maintained by an inductance, not shown.

The current flowing through the bidirectional switch causes the discharge of the parasitic capacitive elements. This results in a decrease of the voltage V210-1 across the second switch. When voltage V210-1 is no longer sufficient to maintain the value of current I711, the latter decreases. At a time t2, current I711 crosses current threshold ITH. At this time, the voltage across the second switch is zero or substantially zero (with respect to voltage V200). Due to the fact that the first switch is maintained in the on state during the considered cycles of signal SQW, the voltage across the bidirectional switch is zero or substantially zero at time t2.

The crossing of current threshold ITH by current I712 results in that signal S802 (FIG. 8) switches to the high level and authorizes signal SC to take the high level. Thus, signal SC switches to the high level at time t2, which causes the switching of the bidirectional switch to the on state.

A ZVS-type switching of the bidirectional switch during periods for which the first switch is maintained in the on state has thus been implemented. ZVS-type switchings enable to improve the reliability and the efficiency of the converter.

According to an advantage, the duration between times t1 and t2 for which the two bidirectional switches IH and IL (FIG. 1) of the switching cell are in the off state (that is, the dead switching time), is simply obtained without having, for example, to preset it to different predefined values according to the voltage across the switching cell.

In the preferred case where module 710 further comprises transistor 801, resistive element 821, and JFET transistor 811, the operation of module 710 is, during periods when the second switch is maintained in the on state (periods 512 in the example of FIG. 5), similar to that described hereabove for the periods when the first switch is maintained in the on state, that is:

when the first switch is in the off state, to conduct current I711; and
to switch the first switch from the off state to an on state at a time when current I711 becomes smaller than a current threshold, for example, current threshold ITH.

The switchings of the bidirectional switch are then of ZVS type whatever the detected sign of the voltage across the bidirectional switch.

Figure 10:
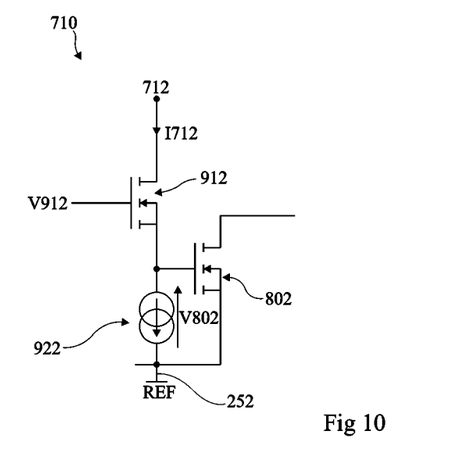
FIG. 10 partially and schematically shows an example of another embodiment of a module of the circuit of FIG. 7.

FIG. 10 partially and schematically shows another embodiment of module 710 of the circuit of FIG. 7. This embodiment differs from that of FIG. 8 in that:

FET transistor 812 (FIG. 8) is replaced with an N-channel field-effect transistor 912 coupling input 712 to the control terminal of transistor 802 and controlled by a voltage V912. Voltage V912 is referenced to the potential REF of common source terminal 252; and
preferably, resistive element 822 (FIG. 8) is replaced with a current source 922 coupling the control terminal of transistor 802 to common source terminal 252.

The operation is the same as that described hereabove for the embodiment of FIG. 8. Transistor 912 maintains control voltage V802 at a value close to that of voltage V912, to within a threshold voltage of transistor 911. Source 922, or resistive element 822 (FIG. 8) in the case where resistive element 822 is not replaced with source 922, consumes a current.

Similarly, JFET transistor 811 (FIG. 8) may be replaced with an N-channel field-effect transistor 912 coupling input 711 to the control terminal of transistor 801 and controlled by a voltage similar, for example, equal, to voltage V912. Resistive element 822 (FIG. 8) may also be replaced with a current source coupling the control terminal of transistor 801 (FIG. 8) to common source terminal 252.

Figure 11:
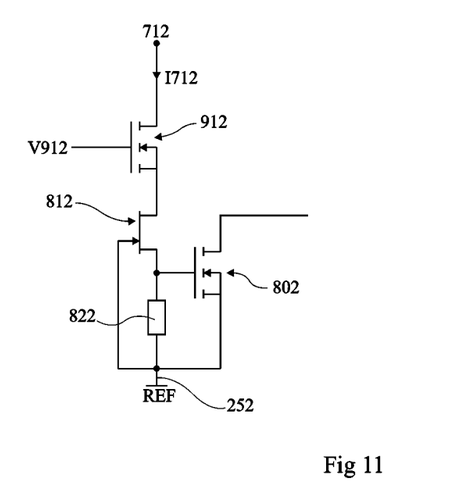
FIG. 11 partially and schematically shows an example of still another embodiment of a module of the circuit of FIG. 7.

FIG. 11 partially and schematically shows another embodiment of a module of the circuit of FIG. 7. This embodiment differs from that of FIG. 8 in that JFET transistor 812 has its drain coupled to input 712 by a transistor 912 identical or similar to the transistor 912 described hereabove in relation with FIG. 10, controlled by voltage V912.

According to an advantage, transistor 912 enables to avoid for JFET transistor 812 to be submitted to the entire voltage across the second switch. This voltage is mainly blocked by transistor 912.

Similarly, JFET transistor 811 (FIG. 8) may have its drain coupled to input 712 (FIG. 8) by a transistor identical or similar to transistor 912, with the same advantage as hereabove.

Various embodiments and variants have been described. Those skilled in the art will understand that certain features of these embodiments can be combined and other variants will readily occur to those skilled in the art. In particular, embodiments differ from those of FIGS. 8, 10, and 11, in that the positions of the source of the control voltage of transistors 801 and/or 802 are exchanged with those of the loads consuming respective currents I711 and/or I712.

Further, although, in the above-described examples, high and low levels of signals form levels for setting switches to the on and off states, any first switch turn-on level and any second switch turn-off level may be selected for each of these signals.

Finally, the practical implementation of the described embodiments and variants is within the abilities of those skilled in the art based on the functional indications given hereabove.

What is claimed is:

1. Method of controlling a bidirectional switch, comprising:

first and second field-effect transistors electrically in series between first and second terminals of the bidirectional switch;
a detector of a sign of the voltage between said first terminal and said second terminal, said detector being powered by a voltage referenced to the potential of a first node to which are connected common sources of the first and second transistors, comprising steps of:
receiving a voltage between the first and second terminals of the bidirectional switch;
detecting, based on the received voltage, a first sign of said voltage;
at least while the first sign is being detected, coupling the first terminal to said first node, potentials of control terminals of the first and second transistors being referenced to the potential of said first node.

2. Method according to claim 1, wherein the step of coupling the first terminal to said first node comprises maintaining the first transistor in an on state.

3. Method according to claim 1, further comprising, during the step of coupling the first terminal to said first node, steps of:
  setting the second transistor to an off state;
  when the second transistor is in the off state, generating a current in parallel with the second transistor between the terminals of the second transistor, powered with a voltage between the terminals of the second transistor; and
  switching the second transistor from the off state to an on state at a time when the current in parallel with the second transistor becomes smaller than a current threshold.

4. Method according to claim 1, further comprising steps of:
  detecting a second sign of the voltage between the first and second terminals of the bidirectional switch; and
  at least while the second sign is being detected, connecting the second terminal to said first node, preferably by maintaining the second transistor in an on state.

5. Method according to claim 4, further comprising, during the step of connection of the second terminal to said connection node, steps of:
  setting the first transistor to an off state;
  when the first transistor is in the off state, generating a current in parallel with the first transistor, powered with a voltage between the terminals of the first transistor; and
  switching the first transistor from the off state to an on state at a time when the current in parallel with the first transistor becomes smaller than a current threshold.

6. Method according to claim 1, wherein the transistors are of the same channel type.

7. Method according to claim 6, wherein said bidirectional switch is monolithic and comprises a substrate coupled to the common sources.

8. Method according to claim 1, wherein third and fourth field-effect transistors are electrically in series between said first and second terminals of the bidirectional switch, a first connection node in series with the first and second transistors being common with a second connection node in series with the third and fourth transistors.

9. Circuit comprising:
  first and second transistors forming a bidirectional switch with common sources and being electrically in series between first and second terminals,
  a detector of a sign of the voltage between said first terminal and said second terminal, said detector being powered by a voltage referenced to the potential of a first node to which are connected said common sources of said first and second transistors, and an output of said detector being used by circuit elements for, at least while a first sign is being detected, coupling the first terminal to said first node, and
  first and second driver circuits each controlling one of said first and second transistors based on a control signal, potentials of control terminals of the first and second transistors being referenced to the potential of said first node; said driver circuits being powered between a power supply voltage referenced to said potential of said first node.

10. Circuit according to claim 9, comprising terminals respectively coupled to each terminal of the bidirectional switch, to the common source terminal of the transistors, and to the control terminals of the transistors.

11. Circuit according to claim 10, further comprising first and second OR logical gates, a first input of both gates receiving said control signal and a second input of each gate being coupled to an output of said detector, the output of the first and second OR gates being respectively coupled to an input of said first and second driver circuits.

12. Circuit according to claim 10, comprising:
  a fifth transistor configured to deliver a first signal for authorizing the setting to the on state of the second transistor;
  a first source of a control voltage of the fifth transistor, coupled to a conduction terminal of the second transistor; and
  a first load coupling the control terminal of the fifth transistor to another conduction terminal of the second transistor.

13. Circuit according to claim 12, further comprising:
  a sixth transistor configured to deliver a second signal for authorizing the setting to the on state of the first transistor;
  a second source of a control voltage of the sixth transistor, coupled to a conduction terminal of the first transistor; and
  a second load coupling the control terminal of the sixth transistor to another conduction terminal of the sixth transistor.

14. Device comprising a circuit according to claim 9 and said bidirectional switch.

15. Switched-mode converter comprising one or a plurality of devices according to claim 14.

16. Converter according to claim 15, configured to receive and/or deliver an AC voltage, comprising two bidirectional switches, each formed of the first and second transistors of one of said devices, the two bidirectional switches being electrically in series between two nodes of application of the AC voltage.

17. Monolithic device comprising a circuit according to the device of claim 14.

18. Monolithic device comprising a circuit according to claim 9.

* * * * *